(12) United States Patent
Arai et al.

(10) Patent No.: US 9,412,819 B2
(45) Date of Patent: Aug. 9, 2016

(54) SEMICONDUCTOR DEVICE AND MANUFACTURING METHOD THEREOF

(71) Applicant: Renesas Electronics Corporation, Koutou-ku, Tokyo (JP)

(72) Inventors: Koichi Arai, Ibaraki (JP); Kenichi Hisada, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/873,185

(22) Filed: Oct. 1, 2015

(65) Prior Publication Data

US 2016/0099316 A1 Apr. 7, 2016

(30) Foreign Application Priority Data

Oct. 3, 2014 (JP) ................................. 2014-205070

(51) Int. Cl.
*H01L 29/10* (2006.01)
*H01L 29/16* (2006.01)
(Continued)

(52) U.S. Cl.
CPC .......... *H01L 29/1033* (2013.01); *H01L 21/047* (2013.01); *H01L 29/1095* (2013.01); *H01L 29/1608* (2013.01); *H01L 29/66734* (2013.01); *H01L 29/7813* (2013.01)

(58) Field of Classification Search
CPC ..................... H01L 29/1608; H01L 29/66068; H01L 29/1095; H01L 29/7813; H01L 29/7397; H01L 29/1037; H01L 29/66666; H01L 29/7827; H01L 29/4236; H01L 29/7802; H01L 29/41766
See application file for complete search history.

(56) References Cited

U.S. PATENT DOCUMENTS

| 5,976,936 A * | 11/1999 | Miyajima | ........... H01L 29/7828 257/E21.066 |
| 6,342,709 B1 * | 1/2002 | Sugawara | ........... H01L 29/0619 257/138 |

(Continued)

FOREIGN PATENT DOCUMENTS

| JP | 2006-351743 A | 12/2006 |
| JP | 2006-351744 A | 12/2006 |

(Continued)

OTHER PUBLICATIONS

Cooper et al., "On-state Characteristics of SiC Power UMOSFETS on 115-μm Drift Layers," *IEEE Electron Device Letters*, Apr. 2005, 26(4): pp. 255-257.

(Continued)

*Primary Examiner* — Bac Au
(74) *Attorney, Agent, or Firm* — Shapiro, Gabor and Rosenberger, PLLC

(57) ABSTRACT

In a silicon carbide semiconductor device having a trench type MOS gate structure, the present invention makes it possible to inhibit the operating characteristic from varying. A p-type channel layer having an impurity concentration distribution homogeneous in the depth direction at the sidewall part of a trench is formed by applying angled ion implantation of p-type impurities to a p-type body layer formed by implanting ions having implantation energies different from each other two or more times after the trench is formed. Further, although the p-type impurities are introduced also into an n⁻-type drift layer at the bottom part of the trench when the p-type channel layer is formed by the angled ion implantation, a channel length is stipulated by forming an n-type layer having an impurity concentration higher than those of the p-type channel layer, the p⁻-type body layer, and the n⁻-type drift layer between the p⁻-type body layer and the n⁻-type drift layer. By those measures, it is possible to inhibit the operating characteristic from varying.

15 Claims, 13 Drawing Sheets

(51) Int. Cl.
*H01L 29/78* (2006.01)
*H01L 29/66* (2006.01)
*H01L 21/04* (2006.01)

(56) References Cited

U.S. PATENT DOCUMENTS

| | | | |
|---|---|---|---|
| 7,595,238 | B2 | 9/2009 | Tsuji |
| 7,915,617 | B2* | 3/2011 | Ogura .................. H01L 29/086 257/76 |
| 8,193,564 | B2* | 6/2012 | Suzuki ............... H01L 29/0623 257/216 |
| 9,012,984 | B2* | 4/2015 | Cheng ................ H01L 29/7827 257/288 |
| 2006/0102908 | A1 | 5/2006 | Imai et al. |
| 2007/0015333 | A1 | 1/2007 | Kishimoto et al. |
| 2013/0214348 | A1 | 8/2013 | Takeda |
| 2014/0264564 | A1* | 9/2014 | Cheng ................ H01L 29/7827 257/330 |
| 2015/0179744 | A1* | 6/2015 | Mine ................ H01L 29/66068 257/77 |

FOREIGN PATENT DOCUMENTS

| | | |
|---|---|---|
| JP | 2008-016747 A | 1/2008 |
| JP | 2012-099834 A | 5/2012 |
| JP | 2013-219161 A | 10/2013 |

OTHER PUBLICATIONS

Extended European Search Report, issued Mar. 18, 2016, in European Patent Application No. 15184684.7.

\* cited by examiner

SEMICONDUCTOR DEVICE AND MANUFACTURING METHOD THEREOF

CROSS-REFERENCE TO RELATED APPLICATIONS

The disclosure of Japanese Patent Application No. 2014-205070 filed on Oct. 3, 2014 including the specification, drawings and abstract is incorporated herein by reference in its entirety.

BACKGROUND

The present invention relates to a semiconductor device and manufacturing technology thereof, and for example, relates to a silicon carbide semiconductor device having a trench type MOS (Metal Oxide Semiconductor) gate structure and a technology effectively applicable to the manufacturing of the semiconductor device.

In Japanese Unexamined Patent Application Publication No. 2013-219161 (Patent Literature 1), described is a semiconductor device having a first conductivity type source region formed at the surface part of a well region, a trench formed in a predetermined region of the source region so as to expose at least the bottom surface at a drift layer, and a first conductivity type channel layer being the well region and being formed along the side surface of the trench. The channel layer is formed only between the drift layer and the source region, and the concentration of the first conductivity type impurities in the channel layer is homogeneous overall.

Further, in Japanese Unexamined Patent Application Publication No. 2012-099834 (Patent Literature 2), described is a MOS gate type silicon carbide semiconductor device having a silicon semiconductor layer of another conductivity type formed between a gate oxide film being in contact with the sidewall of a trench and a channel inversion layer surface. Disclosed is a technology of forming a silicon semiconductor layer of another conductivity type with an amorphous silicon layer, scanning the amorphous silicon layer with laser light in a direction not intersecting with the direction where the channel current of a MOS gate type silicon carbide semiconductor device flows, and transforming the amorphous silicon layer into polysilicon.

Further, in Japanese Unexamined Patent Application Publication No. 2008-016747 (Patent Literature 3), described is a trench MOS type silicon carbide semiconductor device having a first conductivity type drift layer, a second conductivity type base layer, and a first conductivity type source layer, those being stacked over a first conductivity type semiconductor substrate in this order, a stripe-shaped trench extending from the surface of the first conductivity type source layer and reaching the drift layer, and a second conductivity type layer formed at the bottom part of the trench. The second conductivity type layer formed at the bottom part of the trench and the second conductivity type base layer are coupled electrically conductively through a second conductivity type region formed at the sidewall surface in the trench width direction at both the ends of the stripe-shaped trench.

Further, in Japanese Unexamined Patent Application Publication No. 2006-351744 (Patent Literature 4), described is a method of manufacturing a silicon carbide semiconductor device by applying a surface treatment step of etching a semiconductor substrate surface about several nm to 0.1 μm by supplying hydrogen in a depressurized reaction furnace of a temperature of 1,500° C. or higher prior to a step of forming a gate oxide film over the silicon carbide semiconductor substrate.

Further, in Japanese Unexamined Patent Application Publication No. 2006-351743 (Patent Literature 5), described is a MOS gate type silicon carbide semiconductor device having a polysilicon gate electrode formed over the surface of a region of the other conductivity type interposed by a region of an conductivity type through a gate oxide film, and the region of the other conductivity type being in contact with the gate oxide film comprises a silicon semiconductor layer of the other conductivity type.

CITATION LIST

Patent Literature

Patent Literature 1: Japanese Unexamined Patent Application Publication No. 2013-219161
Patent Literature 2: Japanese Unexamined Patent Application Publication No. 2012-099834
Patent Literature 3: Japanese Unexamined Patent Application Publication No. 2008-016747
Patent Literature 4: Japanese Unexamined Patent Application Publication No. 2006-351744
Patent Literature 5: Japanese Unexamined Patent Application Publication No. 2006-351743

SUMMARY

In a silicon carbide semiconductor device having a trench type MOS gate structure, a $p^-$-type body layer that is to be a channel region is formed by implanting ions having implantation energies different from each other two or more times. As a result, the impurity concentration of the $p^-$-type body layer varies in the depth direction along the side surface of a trench and the impurity concentration of the $p^-$-type body layer exposed at the side surface of the trench, namely a channel surface (channel inversion layer surface), comes to be unhomogeneous. To cope with that, the impurity concentration at the channel surface is homogenized by applying angled ion implantation of p-type impurities to the $p^-$-type body layer exposed at the side surface of the trench after the trench is formed in the $p^-$-type body layer.

In the angled ion implantation however, since p-type impurities are introduced also into an $n^-$-type drift layer at the bottom part of a trench, an arising problem is that a channel length is hardly controlled and the operating characteristic of a silicon carbide semiconductor device having a trench type MOS gate structure varies.

Other problems and novel features will be obvious from the descriptions and attached drawings in the present specification.

According an embodiment, a p-type channel layer having an impurity concentration distribution homogeneous in the depth direction along the side surface of a trench is formed at the sidewall part of the trench by applying angled ion implantation of p-type impurities to a $p^-$-type body layer formed by implanting ions having implantation energies different from each other two or more times after the trench is formed. Further, a channel length is stipulated by forming an n-type layer having an impurity concentration higher than a p-type channel layer, a $p^-$-type body layer, and an $n^-$-type drift layer between the $p^-$-type body layer and the $n^-$-type drift layer. Through those measures, the operating characteristic is inhibited from varying.

According to an embodiment, in a silicon carbide semiconductor device having a trench type MOS gate structure, it is possible to inhibit the operating characteristic from varying.

DETAILED DESCRIPTION

In the following embodiments, if necessary for convenience sake, each of the embodiments is explained by dividing it into plural sections or embodiments but, unless otherwise specified, they are not unrelated to each other and are in the relationship of one being a modified example, a detail, a supplemental explanation, or the like of a part or the whole of another.

Further in the following embodiments, when the number of elements and others (including the number of pieces, a numerical value, a quantity, a range, and others) are referred to, except the cases of being specified and being limited obviously to a specific number in principle and other cases, the number is not limited to a specific number and may be larger or smaller than the specific number.

Further in the following embodiments, it goes without saying that the constituent components (including a component step and others) are not necessarily essential except the cases of being specified and being obviously thought to be essential in principle and other cases.

Further, when "to comprise A", "to be made from A", "to have A", or "to include A" is referred to, it goes without saying that a component other than A is not excluded except the case of specifying that only the component is intended and other cases. Likewise in the following embodiments, when a shape, positional relationship, and the like of a constituent component or the like are referred to, they substantially include those approximate or similar to the shape and the like except the cases of being specified and being obviously thought to be otherwise in principle and other cases. The same goes for the numerical value and the range.

Further, in all the drawings for explaining the following embodiments, members having identical function are represented with an identical code in principle and are not explained repeatedly. Embodiments are hereunder explained in detail in reference to the drawings.

Meanwhile, the expression "+" or "−" used here is a code representing a relative concentration of impurities having an conductivity type of an n-type or a p-type, and for example the concentration of n-type impurities increases in the order of "$n^-$", "n", and "$n^+$" and the concentration of p-type impurities increases in the order of "$p^-$", "p", and "$p^+$".

(Detailed Explanation of Problem)

Figure 13:
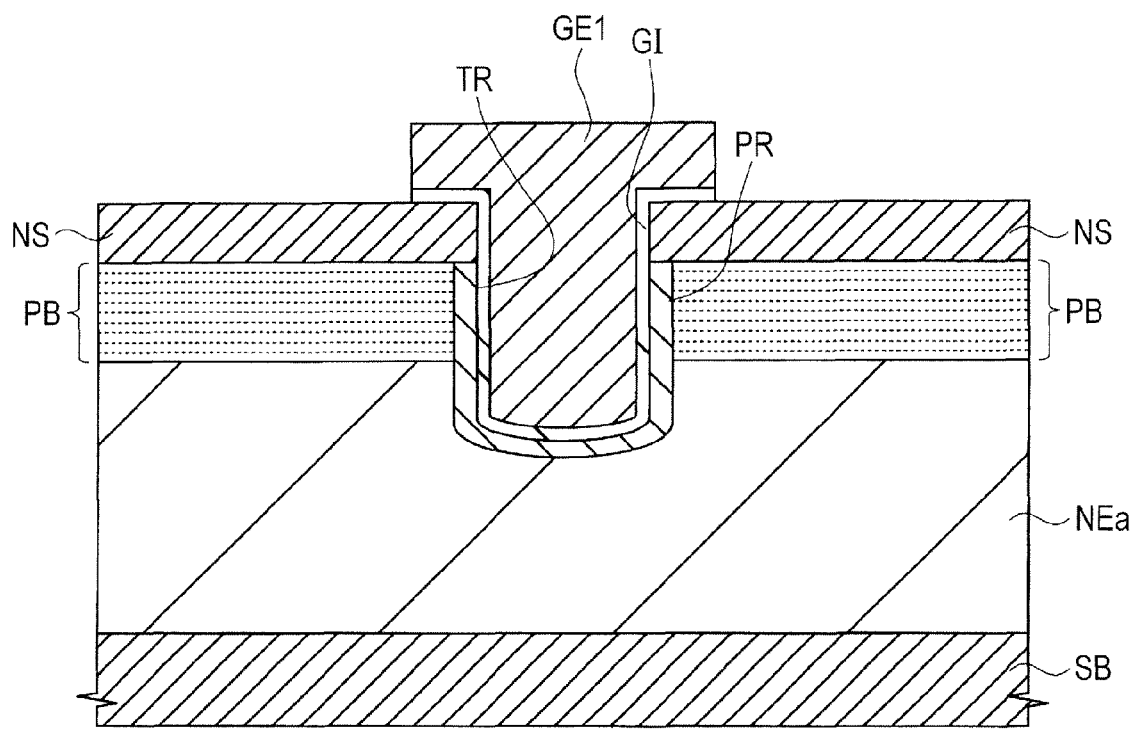
FIG. 13 is a sectional view of the substantial part of a silicon carbide semiconductor device having a trench type MOS gate structure studied by the present inventors.

Firstly, the problem to be solved in a silicon carbide semiconductor device having a trench type MOS gate structure found by the present inventors is explained hereunder in reference to Fi. 13 because the configuration and the manufacturing method of a silicon carbide semiconductor device having a trench type MOS gate structure according to the present embodiment seems to be more obvious by the explanation. FIG. 13 is a sectional view of the substantial part of a silicon carbide semiconductor device having a trench type MOS gate structure studied by the present inventors.

A silicon carbide semiconductor device is configured by forming an $n^-$-type drift layer NEa showing the conductivity of an n-type, a $p^-$-type body layer PB showing the conductivity of a p-type, and an $n^+$-type source layer NS in sequence over the main surface of a substrate SB showing the conductivity of the n-type. The substrate SB functions as a drain layer and the $p^-$-type body layer PB functions as a channel region. The impurity concentration of the substrate SB is $1 \times 10^{18}$ $cm^{-3}$ or more for example, the impurity concentration of the $n^-$-type drift layer NEa is about $8 \times 10^{15}$ $cm^{-3}$ for example, the impurity concentration of the $p^-$-type body layer PB is about $1 \times 10^{16}$ $cm^{-3}$ for example, and the impurity concentration of the $n^+$-type source layer NS is $1 \times 10^{19}$ $cm^{-3}$ or more for example.

Further, a trench TR penetrating the $n^+$-type source layer NS and the $p^-$-type body layer PB and reaching the $n^-$-type drift layer NEa is formed, a gate insulating film GI is formed along the inner wall including the side surface and bottom surface of the trench TR, and a first gate electrode GE1 is formed so as to fill the interior of the trench TR. Consequently, the surface exposed at the sidewall part of the trench TR of the $p^-$-type body layer PB interposed between the $n^+$-type source layer NS and the $n^-$-type drift layer NEa comes to be a channel surface.

In a silicon carbide semiconductor device recently, a $p^-$-type body layer PB that is to be a channel region is formed by an ion implantation method in place of a previous epitaxial growth method in order to enhance price competitiveness. Since impurities do not diffuse in silicon carbide (SiC) however, a p⁻-type body layer PB is formed by implanting ions multiple times under implantation conditions (implantation energies and dose quantities for example) different from each other. For example, the p⁻-type body layer PB is formed by implanting ions having implantation energies different from each other two or more times (about ten times for example). As a result, the p⁻-type body layer PB has an impurity concentration distribution in which high impurity concentrations and low impurity concentrations are repeated alternately in the depth direction along the side surface of a trench TR.

Meanwhile, in a silicon carbide semiconductor device, a trench TR is formed in a p⁻-type body layer PB and the surface of the p⁻-type body layer PB exposed at the sidewall part of the trench TR comes to be a channel surface. In the p⁻-type body layer PB however, the impurity concentration varies in the depth direction along the side surface of the trench TR as stated earlier and the impurity concentration at the channel surface comes to be unhomogeneous in such a state. To cope with that, a p-type layer PR is formed by applying angled ion implantation of p-type impurities to a p⁻-type body layer PB exposed at the side surface of a trench TR after the trench TR is formed in the p⁻-type body layer PB. As a result, the impurity concentration over the channel surface is homogenized.

By the angled ion implantation however, p-type impurities are introduced also into an n⁻-type drift layer NEa at the bottom part of a trench TR. Since the impurity concentration of the n⁻-type drift layer NEa is $8 \times 10^{15}$ cm⁻³ for example and the impurity concentration of a p-type layer PR is $2 \times 10^{17}$ cm⁻³ for example, the p-type layer PR is formed at not only the sidewall part but also the bottom part of the trench TR. As a result, an arising problem is that a channel length is hardly controlled and the operating characteristic of a silicon carbide semiconductor device varies.

Embodiment

Silicon Carbide Semiconductor Device

Figure 1:
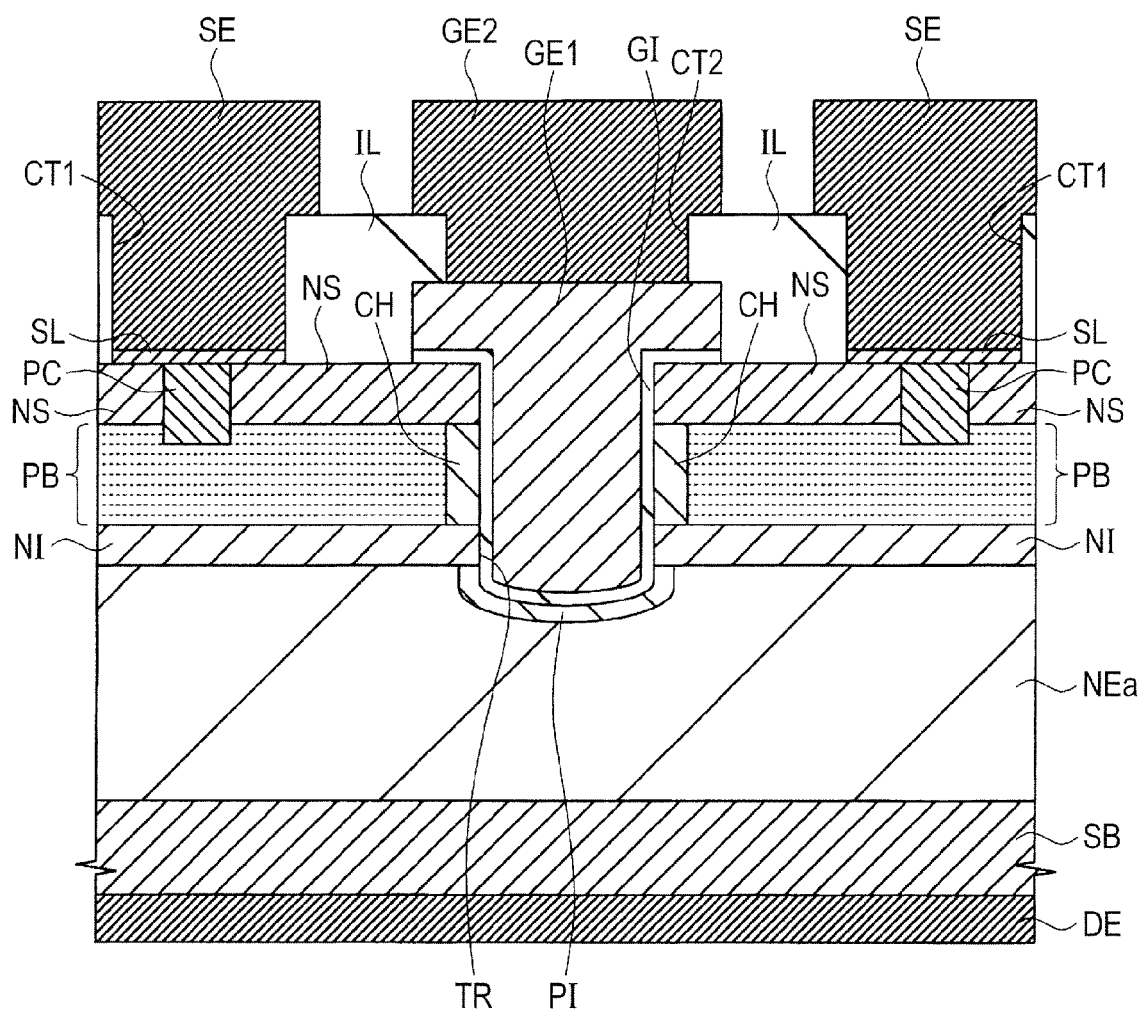
FIG. 1 is a sectional view of the substantial part of a silicon carbide semiconductor device having a trench type MOS gate structure according to an embodiment.

The configuration of a silicon carbide semiconductor device according to the present embodiment is explained in reference to FIG. 1. Here, the configuration of a trench gate type MOSFET (Metal Oxide Semiconductor Field Effect Transistor) that is a silicon carbide semiconductor device having a trench type MOS gate structure is explained. FIG. 1 is a sectional view of the substantial part of a silicon carbide semiconductor device having a trench type MOS gate structure (trench gate type MOSFET).

A silicon carbide semiconductor device according to the present embodiment has a substrate SB comprising silicon carbide (SiC) showing the conductivity of the n-type. Over the main surface, formed are an n⁻-type drift layer NEa, an n-type layer NI, a p⁻-type body layer PB, an n⁺-type source layer NS, a p⁺-type contact layer PC, a trench TR, a p-type channel layer CH, a p-type layer PI, a gate insulating film GI, gate electrodes (a first gate electrode GE1 and a second gate electrode GE2), and a source electrode SE. Further, over the bottom surface on the other side of the main surface, a drain electrode DE is formed.

The substrate SB functions as a drain layer and comprises silicon carbide (SiC) having a 4H-polytype and showing the conductivity of the n-type for example. The thickness of the substrate SB is about 350 μm for example and the impurity concentration is $1 \times 10^{18}$ cm⁻³ or more for example.

The n⁻-type drift layer NEa has the function of keeping withstand voltage and comprises silicon carbide (SiC) being formed over the main surface of the substrate SB and showing the conductivity of the n-type. The n⁻-type drift layer NEa is formed by an epitaxial growth method for example. The thickness of the n⁻-type drift layer NEa is about 10 to 13 μm for example and the impurity concentration is about $8 \times 10^{15}$ cm⁻³ for example.

The n-type layer NI is formed over the top surface (the surface on the other side of the surface being in contact with the substrate SB) of the n⁻-type drift layer NEa and functions as a layer stipulating a channel length. The n-type layer NI is formed by introducing n-type impurities into silicon carbide (SiC) being formed over the main surface of the substrate SB and showing the conductivity of the n-type for example. The thickness of the n-type layer NI is about 0.2 to 0.4 μm for example and the impurity concentration is about $1 \times 10^{18}$ cm⁻³ for example.

The p⁻-type body layer PB is formed over the top surface (the surface on the other side of the surface being in contact with the n⁻-type drift layer NEa) of the n-type layer NI and functions as a channel region. The p⁻-type body layer PB is formed by introducing p-type impurities into silicon carbide (SiC) being formed over the main surface of the substrate SB and showing the conductivity of the n-type for example. The thickness of the p⁻-type body layer PB is about 0.5 μm for example and the impurity concentration is about $1 \times 10^{16}$ cm⁻³ for example.

The p⁻-type body layer PB is formed by implanting ions having implantation energies different from each other into silicon carbide (SiC) two or more times (about ten times for example) and hence has an impurity concentration distribution in which high impurity concentrations and low impurity concentrations are repeated alternately in the depth direction along the side surface of a trench.

The n⁺-type source layer NS is formed over the top surface (the surface on the other side of the surface being in contact with the n-type layer NI) of the p⁻-type body layer PB. The n⁺-type source layer NS is formed by introducing n-type impurities into silicon carbide (SiC) being formed over the main surface of the substrate SB and showing the conductivity of the n-type for example. The thickness of the n⁺-type source layer NS is about 0.3 μm for example and the impurity concentration is $1 \times 10^{19}$ cm⁻³ or more for example.

The p⁺-type contact layer PC is formed in a region different from the region where the n⁺-type source layer NS is formed over the top surface (the surface on the other side of the surface being in contact with the n-type layer NI) of the p⁻-type body layer PB and coupled electrically to the p⁻-type body layer PB. The p⁺-type contact layer PC is formed by introducing p-type impurities into silicon carbide (SiC) being formed over the main surface of the substrate SB and showing the conductivity of the n-type for example. The impurity concentration of the p⁺-type contact layer PC is $1 \times 10^{21}$ cm⁻³ or more for example.

The trench TR is formed so as to penetrate the n⁺-type source layer NS, the p⁻-type body layer PB, and the n-type layer NI in the depth direction and the bottom part reaches the n⁻-type drift layer NEa. The trench TR is formed in order to materialize the trench type MOS gate structure. Here, in the present embodiment, the p-type channel layer CH is formed in the p⁻-type body layer PB located at the sidewall part of the trench TR and the p-type layer PI is formed in the n⁻-type drift layer NEa located at the bottom part of the trench TR as it will be described later. As a result, the n⁺-type source layer NS, the p-type channel layer CH, and the n-type layer NI are exposed at the side surface of the trench TR and the p-type layer PI is exposed at the bottom surface. The distance from the bottom surface of the trench TR to the interface between the substrate SB and the n⁻-type drift layer NEa is about 10 to 12 μm for example.

The p-type channel layer CH is formed in the p⁻-type body layer PB exposed at the side surface of the trench and functions as a channel region. The p-type channel layer CH is formed by applying angled ion implantation of p-type impurities to the p⁻-type body layer PB exposed at the side surface of the trench TR and hence has an impurity concentration distribution homogeneous in the depth direction along the side surface of the trench TR. The impurity concentration of the p-type channel layer CH is about $2\times10^{17}$ cm$^{-3}$ for example and is set at a value more than ten times the impurity concentration (about $1\times10^{16}$ cm$^{-3}$ for example) of the p⁻-type body layer PB.

Both the p⁻-type body layer PB and the p-type channel layer CH function as the channel region. Meanwhile, when the p⁻-type body layer PB is exposed at the side surface of the trench TR that is to be the channel surface, the p⁻-type body layer PB has an impurity concentration distribution in which high impurity concentrations and low impurity concentrations are repeated alternately in the depth direction along the side surface of the trench and hence the operating characteristic of the silicon carbide semiconductor device varies because of the impurity concentration distribution. When the p-type channel layer CH is exposed at the side surface of the trench TR that is to be the channel surface in contrast, the p-type channel layer CH has an impurity concentration distribution homogeneous in the depth direction along the side surface of the trench and hence it is possible to inhibit the operating characteristic of the silicon carbide semiconductor device from varying. In the present embodiment therefore, the p-type channel layer CH having an impurity concentration distribution homogeneous in the depth direction is formed at the side surface of the trench TR that is to be the channel surface.

The p-type layer PI is formed at the n⁻-type drift layer NEa exposed at the bottom surface of the trench. The p-type layer PI is formed by applying angled ion implantation of p-type impurities to the n⁻-type drift layer NEa exposed at the bottom surface of the trench TR and is formed simultaneously with the p-type channel layer CH. Consequently, the impurity concentration of the p-type layer PI is identical to the impurity concentration of the p-type channel layer CH and is about $2\times10^{17}$ cm$^{-3}$ for example. By forming the p-type layer PI at the n⁻-type drift layer NEa exposed at the bottom surface of the trench TR, it is possible to enhance the off performance of the silicon carbide semiconductor device.

The gate insulating film GI is formed along the inner wall including the side surface and bottom surface of the trench TR. The gate insulating film GI comprises an oxide film for example. The thickness of the gate insulating film GI is about 30 to 100 nm for example.

The gate electrodes (the first gate electrode GE1 and the second gate electrode GE2) comprise: the first gate electrode GE1 comprising a polycrystalline silicon film and being formed so as to fill the interior of the trench TR while the gate insulating film GI is interposed; and the second gate electrode GE2 comprising a metal film and being coupled electrically to the first gate electrode GE1. The impurity concentration of the polycrystalline silicon film configuring the first gate electrode GE1 is about $1\times10^{20}$ cm$^{-3}$ for example. The second gate electrode GE2 comprises a multi-layer film formed by stacking a titanium (Ti) film, a titanium nitride (TiN) film, and an aluminum (Al) film in sequence for example. The thickness of the titanium (Ti) film is about 30 nm for example, the thickness of the titanium nitride (TiN) film is about 100 nm for example, and the thickness of the aluminum (Al) film is about 5 μm for example. The titanium (Ti) film and the titanium nitride (TiN) film function as barrier layers to prevent aluminum (Al) from diffusing.

An interlayer insulating film IL is formed at the top surfaces of the first gate electrode GE1, the n⁺-type source layer NS, and the p⁺-type contact layer PC so as to cover the first gate electrode GE1 and the gate insulating film GI. In the interlayer insulating film IL, an opening (contact hole CT2) to expose a part of the top surface of the first gate electrode GE1 and openings (contact holes CT1) to expose parts of the top surfaces of the n⁺-type source layer NS and the p⁺-type contact layer PC are formed. The second gate electrode GE2 is formed through the opening (contact hole CT2) to expose a part of the top surface of the first gate electrode GE1.

The source electrode SE is coupled electrically to parts of the top surfaces of the n⁺-type source layer NS and the p⁺-type contact layer PC through the openings (contact holes CT1) formed in the interlayer insulating film IL. The source electrode SE comprises the same metal film as the second gate electrode GE2 and comprises a multi-layer film formed by stacking a titanium (Ti) film, a titanium nitride (TiN) film, and an aluminum (Al) film in sequence for example. In order to reduce contact resistance, a silicide layer SL, for example a nickel (Ni) silicide layer, may be formed at the interface between parts of the top surfaces of the n⁺-type source layer NS and the p⁺-type contact layer PC and the source electrode SE.

The drain electrode DE is formed over the bottom surface on the other side of the main surface of the substrate SB and comprises a multi-layer film formed by stacking a nickel (Ni) silicide layer, a titanium (Ti) film, a titanium nitride (TiN) film, and a gold (Au) film in sequence for example.

In a silicon carbide semiconductor device according to the present embodiment, a p⁻-type body layer PB is formed by implanting ions into silicon carbide (SiC) multiple times under implantation conditions (implantation energies and dose quantities for example) different from each other as stated earlier. For example, the p⁻-type body layer PB is formed by implanting ions having implantation energies different from each other two or more times (about ten times for example). As a result, the p⁻-type body layer PB has an impurity concentration distribution in which high impurity concentrations and low impurity concentrations are repeated alternately in the depth direction along the side surface of a trench TR. To cope with that, after a trench TR is formed in a p⁻-type body layer PB, a p-type channel layer CH having an impurity concentration distribution homogeneous in the depth direction along the side surface of the trench TR and having an impurity concentration ten or more times higher than that of the p⁻-type body layer PB is formed at the sidewall part of the trench TR by applying angled ion implantation of p-type impurities to the p⁻-type body layer PB exposed at the side surface of the trench TR. As a result, it is possible to inhibit the operating characteristic of the silicon carbide semiconductor device from varying.

Further, the n-type layer NI ($1\times10^{18}$ cm$^{-3}$) having an impurity concentration higher than the p-type channel layer CH ($2\times10^{17}$ cm$^{-3}$), the p⁻-type body layer PB ($1\times10^{16}$ cm$^{-3}$), and the n⁻-type drift layer NEa ($8\times10^{15}$ cm$^{-3}$) is formed between the p⁻-type body layer PB and the n⁻-type drift layer NEa. Although p-type impurities are introduced also into the n⁻-type drift layer NEa at the bottom part of the trench TR when the p⁻-type body layer PB is formed by the angled ion implantation, the channel length of the silicon carbide semiconductor device can be controlled easily by forming the n-type layer NI ($1\times10^{18}$ cm$^{-3}$). Concretely, the p-type channel layer CH and the p$^-$-type body layer PB, which are interposed between the n$^+$-type source layer NS and the n-type layer NI, come to be a channel region and the distance between the n$^+$-type source layer NS and the n-type layer NI (the thickness of the p$^-$-type body layer PB) comes to be a channel length. Consequently, by forming the n-type layer NI, the thickness of the p$^-$-type body layer PB is controlled, the channel length can be stipulated, and hence it is possible to inhibit the operating characteristic of the silicon carbide semiconductor device from varying.

<<Manufacturing Method of Silicon Carbide Semiconductor Device>>

A manufacturing method of a silicon carbide semiconductor device according to the present embodiment is hereunder explained in the order of the steps in reference to FIGS. 2 to 12. Here, a manufacturing method of a trench gate type MOSFET that is a silicon carbide semiconductor device having a trench type MOS gate structure is explained. FIGS. 2 to 12 are sectional views of a substantial part of a silicon carbide semiconductor device having a trench type MOS gate structure (trench gate type MOSFET).

<Drain Layer and n$^-$-Type Drift Layer>

Figure 2:
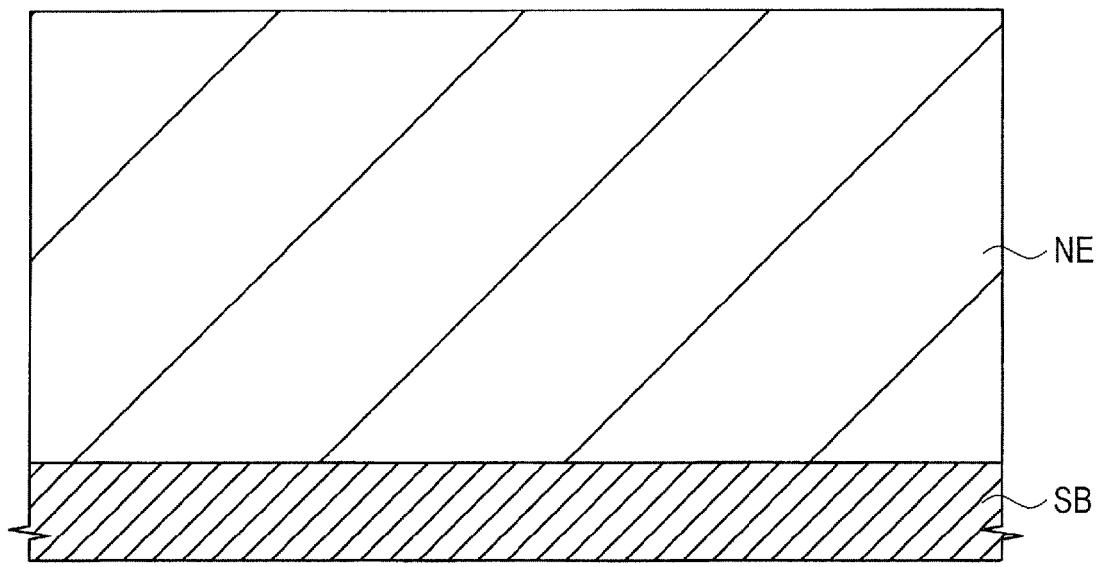
FIG. 2 is a sectional view of a substantial part showing a manufacturing step of a silicon carbide semiconductor device having a trench type MOS gate structure according to an embodiment.

Firstly, as shown in FIG. 2, prepared is a wafer comprising: a substrate SB comprising silicon carbide (SiC) showing the conductivity of the n-type; and an n$^-$-type layer NE comprising silicon carbide (SiC) showing the conductivity of the n-type and being formed over the main surface of the substrate SB by an epitaxial growth method. The substrate SB functions as a drain layer. The thickness of the substrate SB is about 350 μm for example and the impurity concentration is $1\times10^{13}$ cm$^{-3}$ or more for example. Then the thickness of the n$^-$-type layer NE is about 10 to 13 μm for example and the impurity concentration is about $8\times10^{15}$ cm$^{-3}$ for example.

Figure 3:
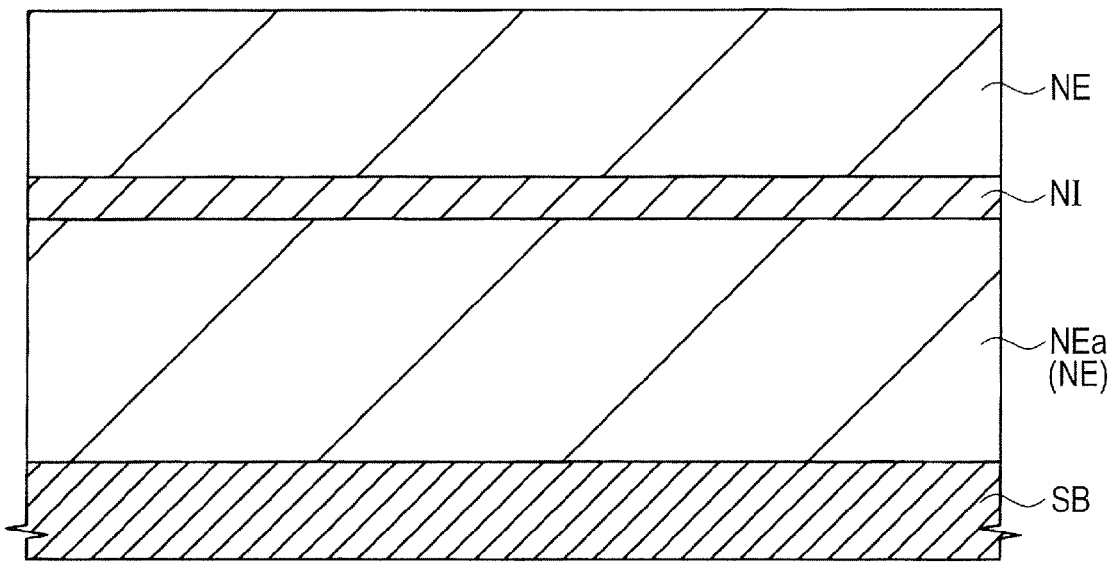
FIG. 3 is a sectional view of the substantial part showing the manufacturing step subsequent to FIG. 2 of the silicon carbide semiconductor device having the trench type MOS gate structure.

Successively, as shown in FIG. 3, an n-type layer NI is formed by introducing n-type impurities, for example nitrogen (N), into the n$^-$-type layer NE by an ion implantation method. The n-type layer NI is formed over the range between the position of 0.8 μm (0.8 μm may be included) and the position of 1.0 μm (1.0 μm may be included) in the depth direction from the top surface (the surface on the other side of the surface being in contact with the substrate SB) of the n$^-$-type layer NE for example and functions as a layer stipulating a channel length. The impurity concentration of the n-type layer NI is higher than that of the n$^-$-type layer NE and is about $1\times10^{13}$ cm$^{-3}$ for example.

By forming the n-type layer NI in the n$^-$-type layer NE, the n$^-$-type layer NE is divided into the top surface side and the bottom surface side of the n-type layer NI and the n$^-$-type layer NE between the substrate SB and the n-type layer NI configures an n$^-$-type drift layer NEa to keep withstand voltage.

As a result, a laminated structure in which the n$^-$-type drift layer NEa, the n-type layer NI, and the n$^-$-type layer NE are formed in sequence over the main surface of the substrate (drain layer) SB is formed. Here, the laminated structure can be formed also by growing the n$^-$-type drift layer NEa, the n-type layer NI, and the n$^-$-type layer NE in sequence over the main surface of the substrate SB by an epitaxial growth method for example.

<P$^-$-Type Body Layer>

Figure 4:
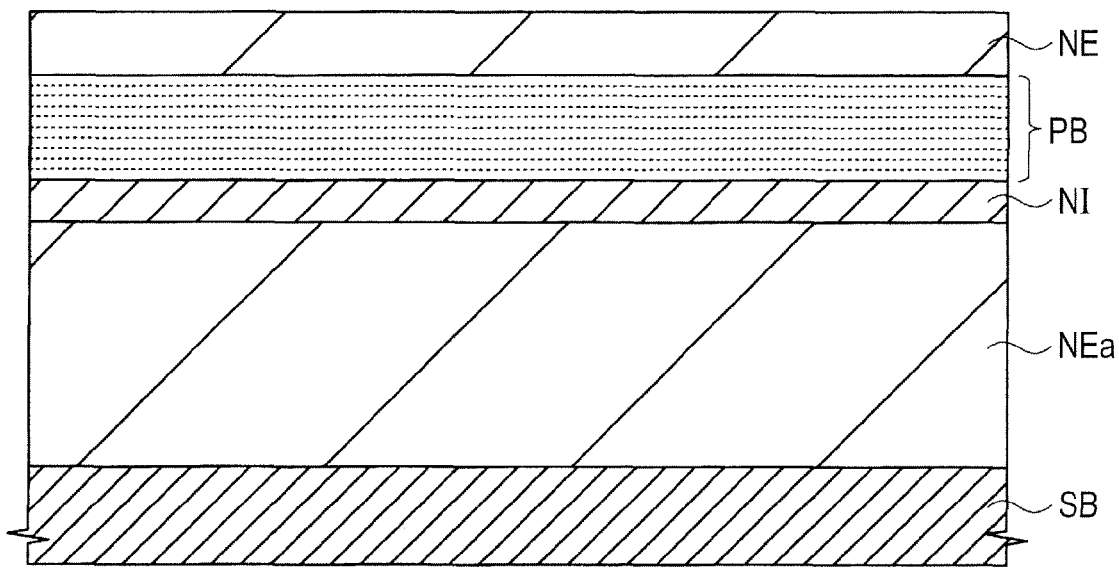
FIG. 4 is a sectional view of the substantial part showing the manufacturing step subsequent to FIG. 3 of the silicon carbide semiconductor device having the trench type MOS gate structure.

Successively, as shown in FIG. 4, a p$^-$-type body layer PB is formed by introducing p-type impurities, for example aluminum (Al), into the n$^-$-type layer NE on the top surface side of the n-type layer NI by an ion implantation method. The p$^-$-type body layer PB is formed over the range between the position of 0.3 μm (0.3 μm may be included) in the depth direction from the top surface (the surface on the other side of the surface being in contact with the n-type layer NI) of the n$^-$-type layer NE and the interface between the n$^-$-type layer NE and the n-type layer NI for example. That is, the p$^-$-type body layer PB is formed neither in the range of 0.3 μm from the top surface of the n$^-$-type layer NE nor in the n$^-$-type drift layer NEa beyond the n-type layer NI.

Here, the p$^-$-type body layer PB is formed by implanting ions having implantation energies different from each other two or more times (about ten times for example). Consequently, the p$^-$-type body layer PB comprises a plurality of p-type layers formed over the range between the position of 0.3 μm in the depth direction from the top surface of the n$^-$-type layer NE and the interface between the n$^-$-type layer NE and the n-type layer NI for example. As a result, it is possible to change the n$^-$-type layer NE into the p-type by forming the p$^-$-type body layer PB but the impurity concentration of the p$^-$-type body layer PB varies in the depth direction. The implantation energies of the ion implantation are selected in the range of 200 to 1,000 keV for example. Further, the impurity concentration of the p$^-$-type body layer PB is about $1\times10^{16}$ cm$^{-3}$ for example.

As a result, over the main surface of the substrate (drain layer) SB, a laminated structure is formed in which the n$^-$-type drift layer NEa, the n-type layer NI, the p$^-$-type body layer PB, and the n$^-$-type layer NE are formed in sequence.

<N$^+$-Type Source Layer>

Figure 5:
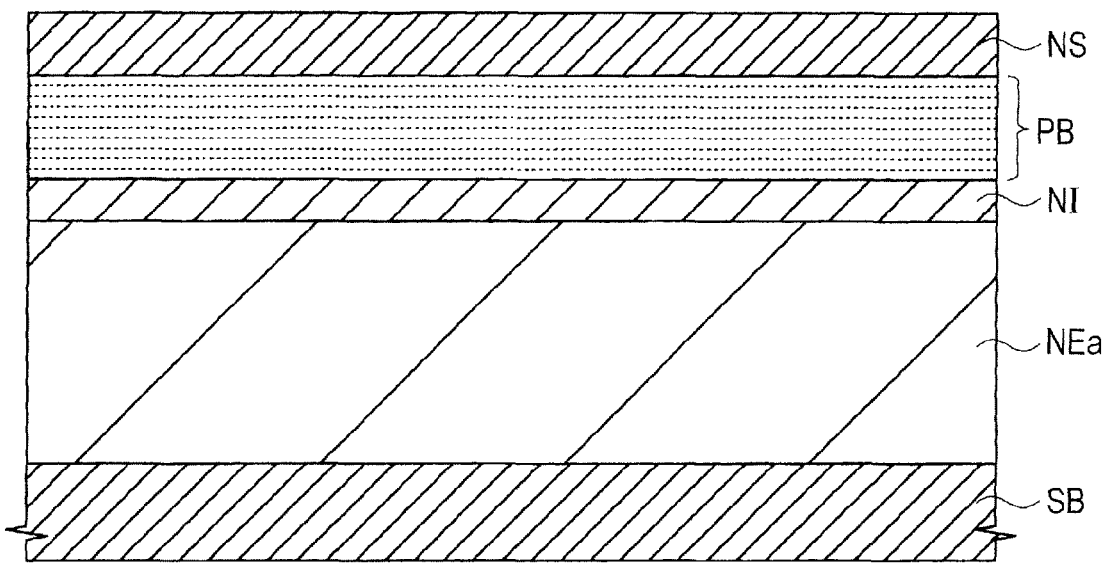
FIG. 5 is a sectional view of the substantial part showing the manufacturing step subsequent to FIG. 4 of the silicon carbide semiconductor device having the trench type MOS gate structure.

Successively, as shown in FIG. 5, an n$^+$-type source layer NS is formed by introducing n-type impurities, for example nitrogen (N), into the n$^-$-type layer NE by an ion implantation method. The n$^+$-type source layer NS is formed over the range between the top surface of the n$^-$-type layer NE and the position of 0.3 μm (0.3 μm may be included) in the depth direction for example.

Here, the n$^+$-type source layer NS is formed by implanting ions having implantation energies different from each other two or more times. Consequently, the n$^+$-type source layer NS comprises a plurality of n-type layers formed over the range between the top surface of the n$^-$-type layer NE and the position of 0.3 μm in the depth direction for example. The implantation energies of the ion implantation are selected in the range of 50 to 150 keV for example. Further, the impurity concentration of the n$^+$-type source layer NS is $1\times10^{19}$ cm$^{-3}$ or more for example.

As a result, over the main surface of the substrate (drain layer) SB, a laminated structure is formed in which the n$^-$-type drift layer NEa, the n-type layer NI, the p$^-$-type body layer PB, and the n$^+$-type source layer NS are formed in sequence.

<P$^+$-Type Contact Layer>

Figure 6:
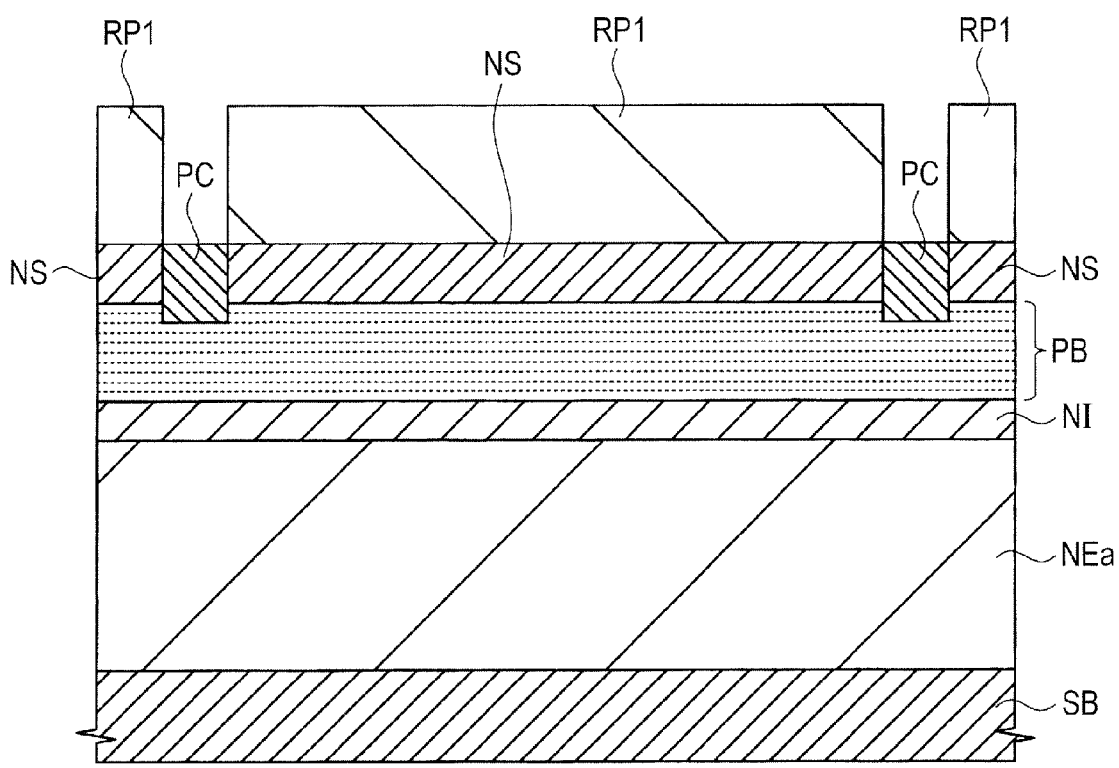
FIG. 6 is a sectional view of the substantial part showing the manufacturing step subsequent to FIG. 5 of the silicon carbide semiconductor device having the trench type MOS gate structure.

Successively, as shown in FIG. 6, a resist pattern RP1 is formed over the top surface (the surface on the other side of the surface being in contact with the p$^-$-type body layer PB) of the n$^+$-type source layer NS by a lithography technology. Then a p$^+$-type contact layer PC reaching the p$^-$-type body layer PB is formed in a desired region by introducing p-type impurities, for example aluminum (Al), into the n$^+$-type source layer NS with the resist pattern RP1 used as a mask by an ion implantation method. Concretely, the p$^+$-type contact layer PC is formed over the range between the top surface of the n$^+$-type source layer NS and the position of 0.5 μm (0.5 μm may be included) in the depth direction for example. The impurity concentration of the p$^+$-type contact layer PC is about double digit higher than that of the n$^+$-type source layer NS and is $1\times10^{21}$ cm$^{-3}$ or more for example.

Successively, after the resist pattern RP1 is removed, a carbon (C) layer (not shown in the figure) is formed over the top surfaces of the n⁺-type source layer NS and the p⁺-type contact layer PC by a CVD (Chemical Vapor Deposition) method for example. The thickness of the carbon (C) layer is about 4 nm for example. Successively, activation annealing is applied to the wafer and the n-type impurities and the p-type impurities, which are ion-implanted through the above steps, are activated. The atmosphere of the activation annealing is an inert gas, for example argon (Ar), and the temperature is about 1,700° C. for example. Successively, the carbon (C) layer is removed by using oxygen ($O_2$) plasma. If the activation annealing is applied with the top surfaces of the n⁺-type source layer NS and the p⁺-type contact layer PC not covered with the carbon (C) layer, the top surfaces (exposed surfaces) of the n⁺-type source layer NS and the p⁺-type contact layer PC get rough. In order to prevent that, it is desirable to cover the top surfaces of the n⁺-type source layer NS and the p⁺-type contact layer PC with the carbon (C) layer when the activation annealing is applied.

<Trench>

Figure 7:
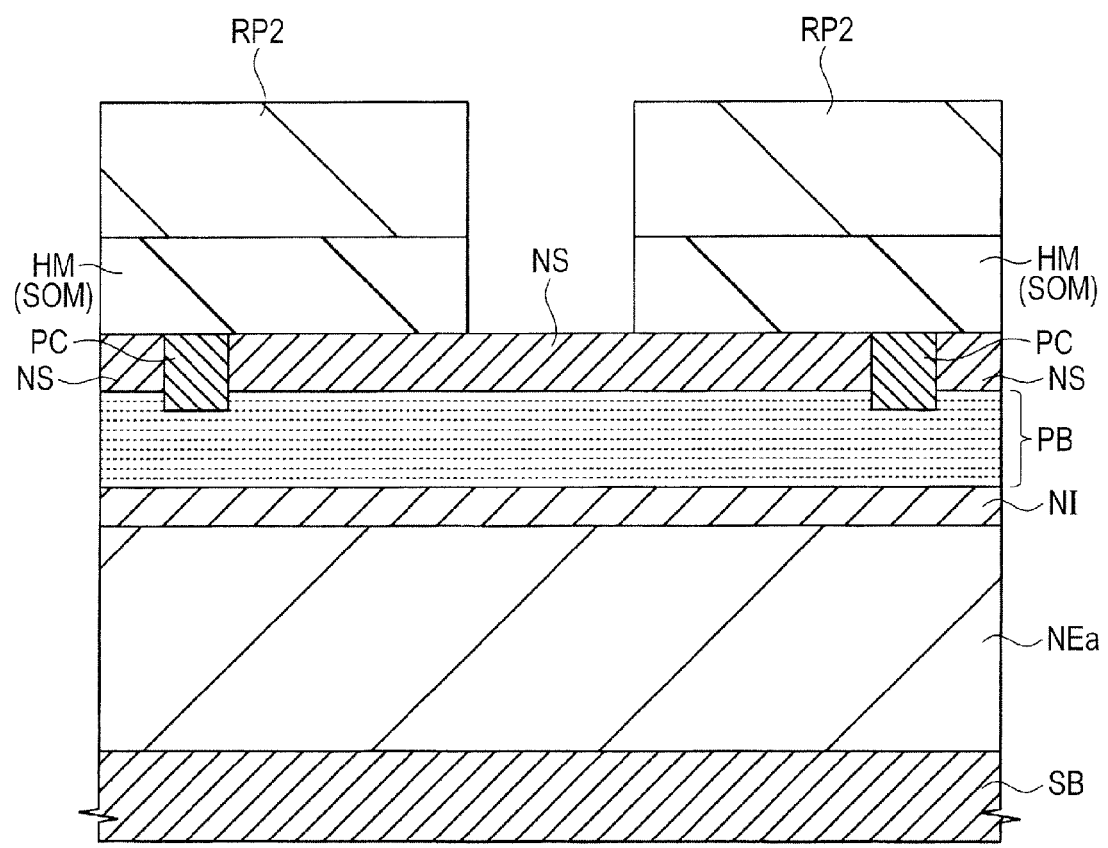
FIG. 7 is a sectional view of the substantial part showing the manufacturing step subsequent to FIG. 6 of the silicon carbide semiconductor device having the trench type MOS gate structure.

Successively, as shown in FIG. 7, an oxide film SOM is formed over the top surfaces of the n⁺-type source layer NS and the p⁺-type contact layer PC by a CVD method for example. The oxide film SOM is a TEOS (Tetra Ethyl Ortho Silicate; $Si(OC_2H_5)_4$) film for example and the thickness is about 0.5 to 1 μm for example.

Successively, a resist pattern RP2 is formed over the top surface (the surface on the other side of the surface being in contact with the n⁺-type source layer NS and the p⁺-type contact layer PC) of the oxide film SOM by a lithography technology. Then the oxide film SOM is processed with the resist pattern RP2 used as a mask by a dry etching method and thus the oxide film SOM in the region where a trench is formed at the succeeding step is removed. As a result, a hard mask HM comprising the oxide film SOM is formed.

Figure 8:
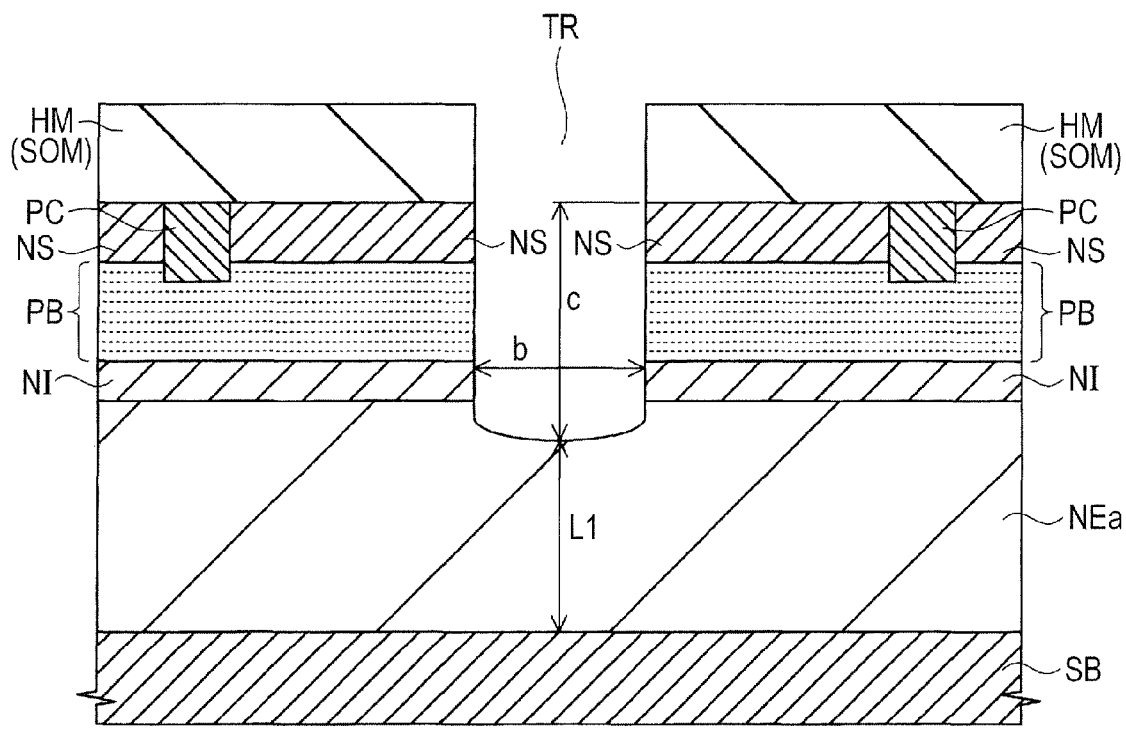
FIG. 8 is a sectional view of the substantial part showing the manufacturing step subsequent to FIG. 7 of the silicon carbide semiconductor device having the trench type MOS gate structure.

Successively, as shown in FIG. 8, after the resist pattern RP2 is removed, the n⁺-type source layer NS, the p⁻-type body layer PB, and the n-type layer NI are processed with the hard mask HM used as a mask by a reactive ion etching method and thus a trench TR reaching the n⁻-type drift layer NEa is formed in a desired region. The width b of the trench TR is about 1 μm for example and the depth c is about 1.2 μm for example. The bottom part and the shoulder part of the trench TR take a round shape.

Here, the trench TR is formed so that the distance L1 from the bottom surface of the trench TR to the interface between the substrate SB and the n⁻-type drift layer NEa may be about 10 to 12 μm for example. In this case, a withstand voltage of about 1,200 V is obtained. Here, the distance L1 is decided in conformity with the withstand voltage of a silicon carbide semiconductor device. Consequently, when a withstand voltage of about 600 V is required for example, the trench TR is formed so that the distance L1 may be about 5 to 6 μm for example.

Meanwhile, the p⁻-type body layer PB is exposed at the side surface of the trench TR. As explained in reference to FIG. 4 earlier, the p⁻-type body layer PB comprises a plurality of p-type layers formed by implanting ions having implantation energies different from each other two or more times (about ten times for example). Since impurities do not diffuse in silicon carbide (SiC), the impurities introduced into silicon carbide (SiC) by an ion implantation method have an impurity concentration peak in the vicinity of the range. Consequently, regions of high impurity concentrations and regions of low impurity concentrations are repeated alternately in the depth direction in the p⁻-type body layer PB and hence the high impurity concentrations and the low impurity concentrations appear alternately in the depth direction along the side surface of the trench TR at the surface of the p⁻-type body layer PB exposed at the sidewall part of the trench TR.

The surface of the p⁻-type body layer PB exposed at the sidewall part of the trench TR comes to be a channel surface of the silicon carbide semiconductor device. As a result, the impurity concentration at the channel surface of the silicon carbide semiconductor device comes to be unhomogeneous in such a state. To cope with that, a p-type channel layer CH having a impurity concentration homogeneous in the depth direction along the side surface of the trench TR is formed at the succeeding step.

<P-Type Channel Layer>

Figure 9:
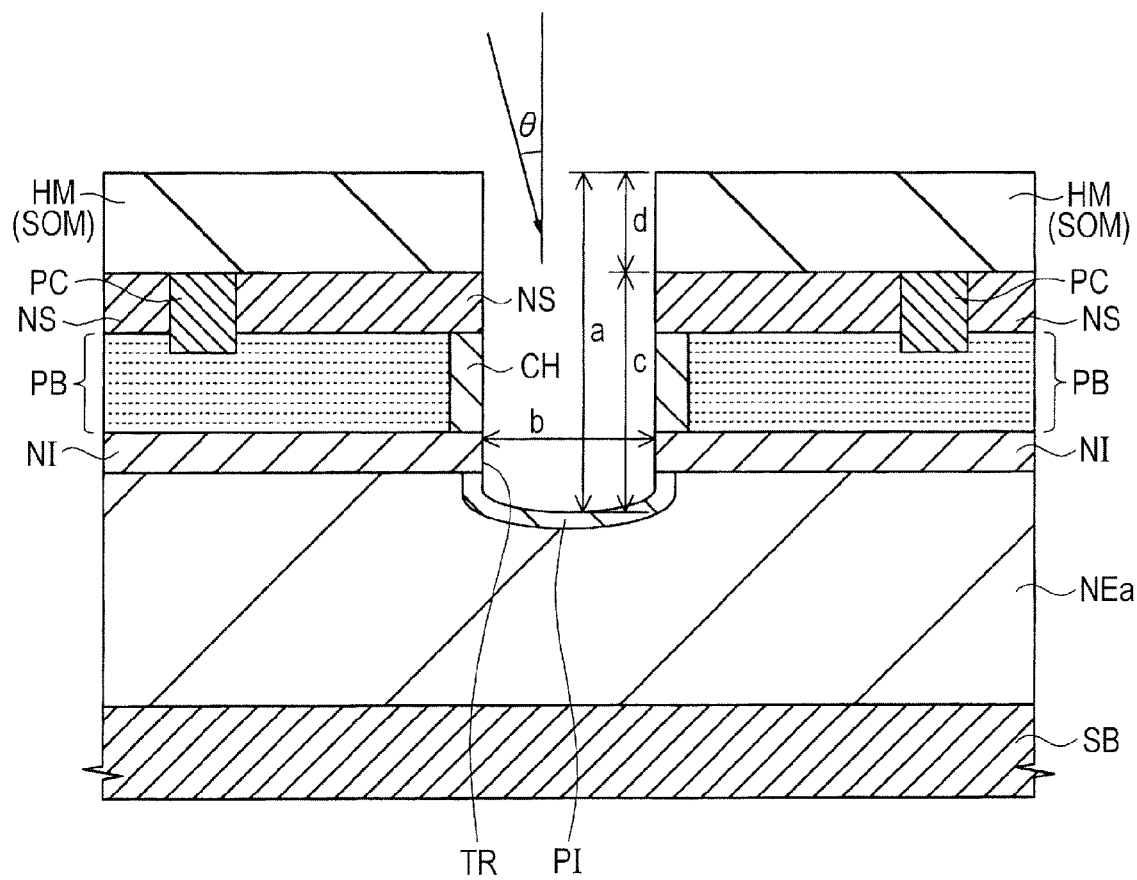
FIG. 9 is a sectional view of the substantial part showing the manufacturing step subsequent to FIG. 8 of the silicon carbide semiconductor device having the trench type MOS gate structure.

Successively, as shown in FIG. 9, a p-type channel layer CH is formed by applying angled ion implantation of p-type impurities, for example aluminum (Al), from the opening of the oxide film SOM to the p⁻-type body layer PB exposed at the side surface of the trench TR. Since the trench TR generally has a rectangular shape in plan view, the p-type channel layer CH is formed at each of the four sides of the rectangular shape in plan view by applying angled ion implantation while a wafer is rotated at the angles of 90 degrees and the direction is changed four times.

The ion implantation angle θ (angle to the normal direction of a wafer) of the angled ion implantation is computed with the expression (1) on the basis of the sum a of the thickness d of an oxide film SOM and the depth c of a trench TR and the width b of the trench TR.

$$\theta = \tan^{-1}(b/2a) \qquad \text{Expression (1)}$$

In the present embodiment, since the thickness d of the oxide film SOM is about 0.5 to 1 μm for example and the depth c of the trench TR is about 1.0 to 1.2 μm for example, the ion implantation angle θ can be decided as 3 to 15 degrees.

The impurity concentration of the p-type channel layer CH is set at about $2 \times 10^{17}$ cm$^{-3}$ for example, which is ten or more times higher than the impurity concentration (about $1 \times 10^{16}$ cm$^{-3}$ for example) of the p⁻-type body layer PB, and the impurity concentration of the p-type channel layer CH in the depth direction along the side surface of the trench TR comes to be homogeneous.

Further, the p-type impurities are introduced also into the n-type layer NI in the angled ion implantation. The impurity concentration of the n-type layer NI however is $1 \times 10^{18}$ cm$^{-3}$ for example and is ten or more times higher than the impurity concentration ($2 \times 10^{17}$ cm$^{-3}$ for example) of the p-type channel layer CH and hence the impurity concentration of the n-type layer NI is not affected even when the angled ion implantation of the p-type impurities is applied. That is, by forming the n-type layer NI, it is possible to stipulate the channel length of a silicon carbide semiconductor device and the region exposed at the side surface of the trench TR and interposed between the n⁺-type source layer NS and the n-type layer NI comes to be the channel surface of the silicon carbide semiconductor device.

Further, p-type impurities are introduced also into the bottom part of the trench TR and a p-type layer PI is formed in the angled ion implantation. That is, both the p-type channel layer CH at the sidewall part of the trench TR and the p-type layer PI at the bottom part of the trench TR are formed through the same step. Since the n-type layer NI is formed between the p-type channel layer CH and the p-type layer PI however, they are separated electrically and the p-type layer PI never configures a part of the channel region of a silicon carbide semiconductor device. Further, by forming the p-type layer PI at the bottom part of the trench TR, it is possible to improve the off withstand voltage of a silicon carbide semiconductor device.

The relationship of the impurity concentrations of the n⁻-type drift layer NEa, the n-type layer NI, the p⁻-type body layer PB, the n⁺-type source layer NS, and the p-type channel layer CH, which have heretofore been formed in the n⁻-type layer NE, is summarized as follows.

The n⁺-type source layer NS ($1 \times 10^{19}$ cm⁻³ or more)>>the n-type layer NI ($1 \times 10^{18}$ cm⁻³)>the p-type channel layer CH ($2 \times 10^{17}$ cm⁻³)>the p⁻-type body layer PB ($1 \times 10^{16}$ cm⁻³)>the n⁻-type drift layer NEa ($8 \times 10^{15}$ cm⁻³).

<Gate Insulating Film, Gate Electrode>

Figure 10:
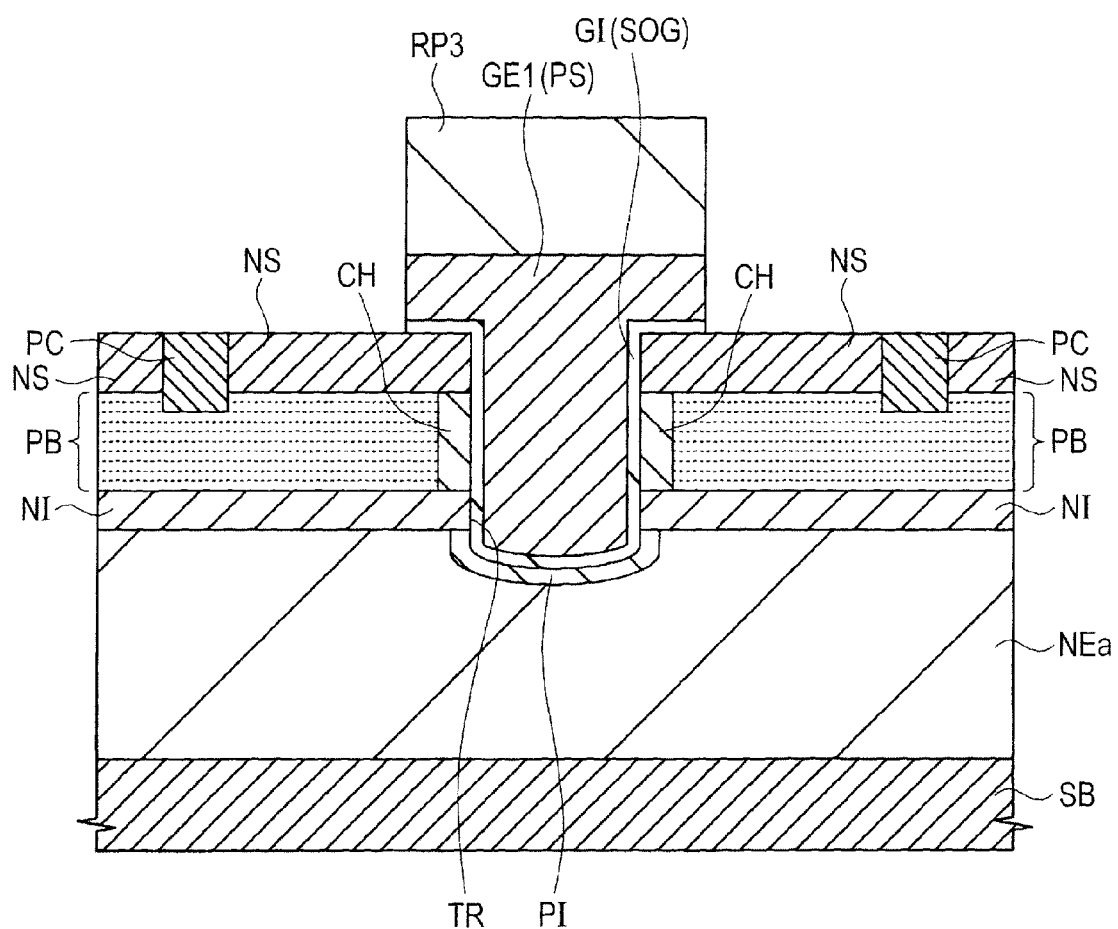
FIG. 10 is a sectional view of the substantial part showing the manufacturing step subsequent to FIG. 9 of the silicon carbide semiconductor device having the trench type MOS gate structure.

Successively, as shown in FIG. 10, after the hard mask HM is removed by a wet etching method, by a thermal oxidation method and a CVD method, an oxide film SOG is formed over the inner wall (side surface and bottom surface) of the trench TR and the top surfaces of the n⁺-type source layer NS and the p⁺-type contact layer PC and successively a polycrystalline silicon film PS containing n-type impurities for example is deposited over the oxide film SOG so as to fill the interior of the trench TR. The thickness of the oxide film SOG is about 30 to 100 nm for example and the impurity concentration of the polycrystalline silicon film PS is about $1 \times 10^{20}$ cm⁻³ for example.

Successively, a resist pattern RP3 is formed over the top surface (the surface on the other side of the surface being in contact with the oxide film SOG) of the polycrystalline silicon film PS by a lithography technology. Then the polycrystalline silicon film PS and the oxide film SOG are processed with the resist pattern RP3 used as a mask by a dry etching method and thus a first gate electrode GE1 comprising the polycrystalline silicon film PS and a gate insulating film GI comprising the oxide film SOG are formed in the interior of the trench TR. In consideration of the alignment shift of the resist pattern RP3, the processing variation caused by the dry etching, and others, the first gate electrode GE1 and the gate insulating film GI are formed so as to have widths larger than the width of the trench TR in plan view.

<Electrode>

Figure 11:
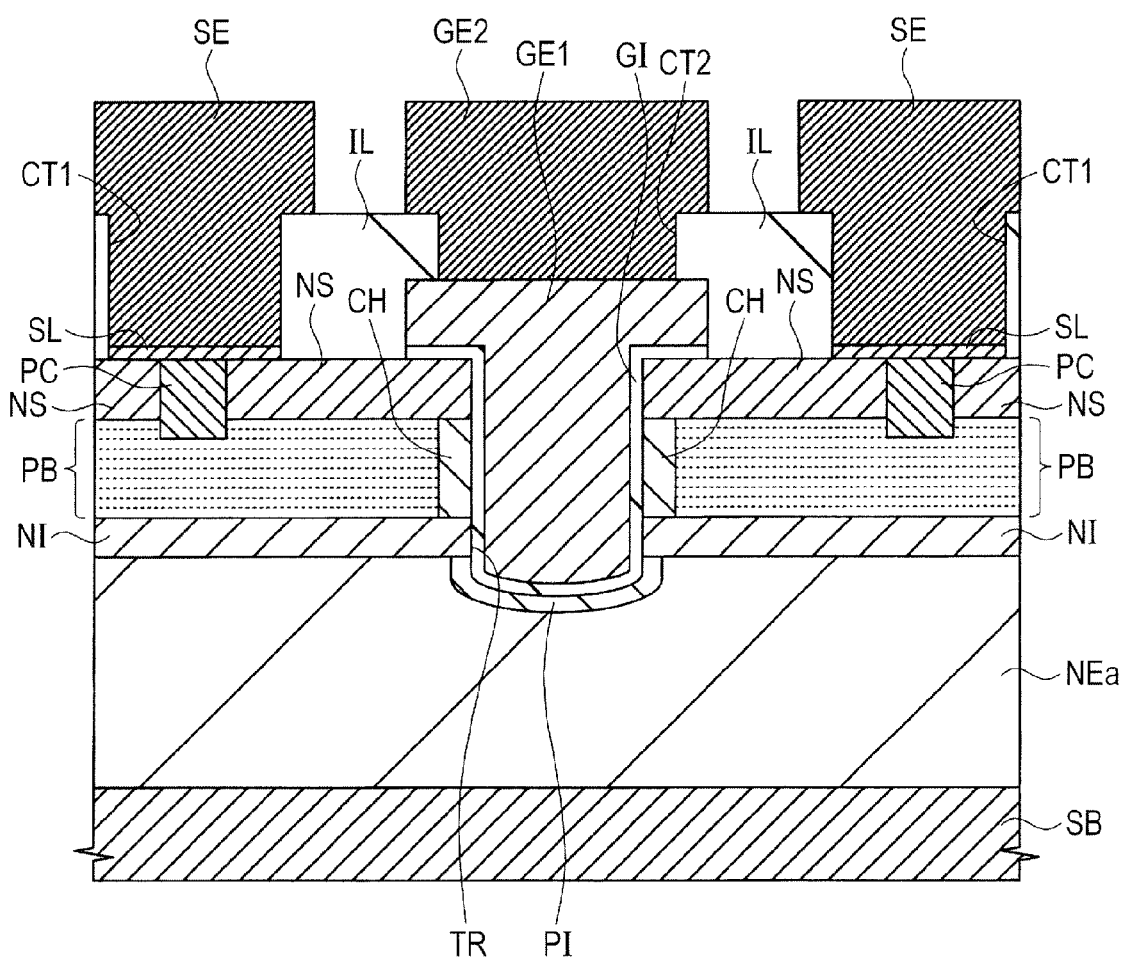
FIG. 11 is a sectional view of the substantial part showing the manufacturing step subsequent to FIG. 10 of the silicon carbide semiconductor device having the trench type MOS gate structure.

Successively, as shown in FIG. 11, after the resist pattern RP3 is removed, an interlayer insulating film IL is formed over the top surfaces of the first gate electrode GE1, the n⁺-type source layer NS, and the p⁺-type contact layer PC so as to cover the first gate electrode GE1 and the gate insulating film GI by a CVD method.

Successively, although they are not shown in the figure, a resist pattern is formed over the top surface (the surface on the other side of the surface being in contact with the first gate electrode GE1, the n⁺-type source layer NS, and the p⁺-type contact layer PC) of the interlayer insulating film IL by a lithography technology and the interlayer insulating film IL is processed with the resist pattern used as a mask by a dry etching method. As a result, contact holes CT1 to expose parts of the top surfaces of the n⁺-type source layer NS and the p⁺-type contact layer PC are formed. Successively, a nickel (Ni) silicide layer SL is formed over the bottom surfaces of the contact holes CT1 by a self-aligning method.

Successively, although they are not shown in the figure, a resist pattern is formed over the top surface of the interlayer insulating film IL by a lithography technology and the interlayer insulating film IL is processed with the resist pattern used as a mask by a dry etching method. As a result, a contact hole CT2 to expose a part of the top surface of the first gate electrode GE1 is formed.

Successively, a titanium (Ti) film, a titanium nitride (TiN) film, and an aluminum (Al) film are deposited in sequence over the interlayer insulating film IL including the interiors of the contact holes CT1 and CT2 by a sputtering method for example. The thickness of the titanium (Ti) film is about 30 nm for example, the thickness of the titanium nitride (TiN) film is about 100 nm for example, and the thickness of the aluminum (Al) film is about 5 μm for example. The titanium (Ti) film and the titanium nitride (TiN) film function as barrier layers to prevent aluminum (Al) from diffusing.

Successively, although they are not shown in the figure, after a resist pattern is formed over the top surface (the surface on the other side of the surface being in contact with the titanium nitride (TiN)) of the aluminum (Al) film by a lithography technology, the aluminum (Al) film, the titanium nitride (TiN) film, and the titanium (Ti) film are processed with the resist pattern used as a mask by a dry etching method. As a result, source electrodes SE and a second gate electrode GE2 having the aluminum (Al) film as the principal conductive layer are formed. The source electrodes SE are coupled electrically to the n⁺-type source layer NS and the p⁺-type contact layer PC through the contact holes CT1 formed in the interlayer insulating film IL. Further, the second gate electrode GE2 is coupled electrically to the first gate electrode GE1 through the contact hole CT2 formed in the interlayer insulating film IL.

Figure 12:
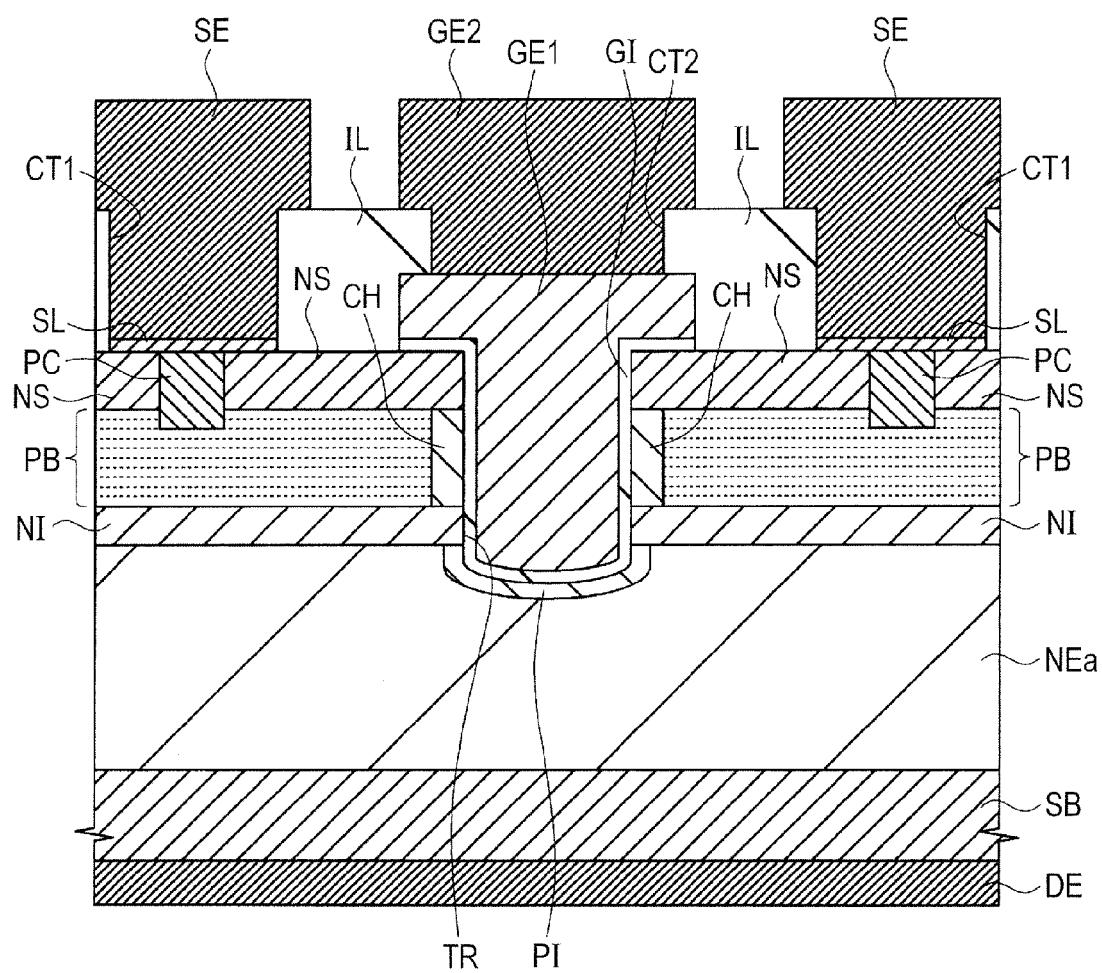
FIG. 12 is a sectional view of the substantial part showing the manufacturing step subsequent to FIG. 11 of the silicon carbide semiconductor device having the trench type MOS gate structure.

Successively, as shown in FIG. 12, after a nickel (Ni) silicide layer is formed over the bottom surface on the other side of the main surface of the substrate SB for example, a titanium (Ti) film, a titanium nitride (TiN) film, and a gold (Au) film are deposited in sequence over the nickel (Ni) silicide layer by a sputtering method. As a result, a drain electrode DE of a laminated structure comprising the nickel (Ni) silicide layer, the titanium (Ti) film, the titanium nitride (TiN) film, and the gold (Au) film is formed over the bottom surface of the substrate SB functioning as a drain layer. The thickness of the titanium (Ti) film is about 100 nm for example, the thickness of the nickel (Ni) film is about 200 nm for example, and the thickness of the gold (Au) film is about 100 nm for example.

Through the above manufacturing steps, a silicon carbide semiconductor device having a trench type MOS gate structure shown in FIG. 1 is nearly completed.

In this way, in a silicon carbide semiconductor device having a trench type MOS gate structure according to the present embodiment, even when a p⁻-type body layer PB that is to be a channel region is formed by implanting ions having implantation energies different from each other two or more times, a p-type channel layer CH having an impurity concentration distribution homogeneous in the depth direction is formed at the side surface of a trench TR. Further, an n-type layer NI that can stipulate a channel length is formed between the p⁻-type body layer PB and an n⁻-type drift layer NEa. By those measures, it is possible to inhibit the operating characteristic of the silicon carbide semiconductor device from varying.

Although the invention established by the present inventors has heretofore been explained concretely on the basis of the embodiment, it goes without saying that the present invention is not limited to the embodiment and can be modified variously within the scope not departing from the tenor of the present invention.

What is claimed is:
1. A semiconductor device comprising:
   a substrate of a first conductivity type comprising silicon carbide;
   a drift layer of the first conductivity type formed over the main surface of the substrate;
   a first layer of the first conductivity type formed over the drift layer;

a body layer of a second conductivity type, which is different from the first conductivity type, formed over the first layer;

a source layer of the first conductivity type formed over the body layer;

a trench formed so as to penetrate the source layer, the body layer, and the first layer and reach the drift layer;

a channel layer of the second conductivity type formed in the body layer exposed at the sidewall part of the trench along the side surface of the trench;

a second layer of the second conductivity type formed in the drift layer exposed at the bottom part of the trench along the bottom surface of the trench;

a gate insulating film formed so as to cover the side surface and bottom surface of the trench;

a gate electrode formed in the interior of the trench through the gate insulating film;

source electrodes coupled electrically to the source layer and the body layer; and a drain electrode coupled electrically to the bottom surface on the other side of the main surface of the substrate, and wherein the impurity concentration of the first layer is higher than the impurity concentration of the drift layer and the impurity concentration of the channel layer and the impurity concentration of the channel layer is higher than the impurity concentration of the body layer.

2. A semiconductor device according to claim 1, wherein the impurity concentration of the channel layer is ten or more times higher than the impurity concentration of the body layer.

3. A semiconductor device according to claim 1, wherein the drift layer, the first layer, the body layer, and the source layer are formed in silicon carbide over the main surface of the substrate.

4. A semiconductor device according to claim 3, wherein the body layer is formed by implanting ions having implantation energies different from each other two or more times into the silicon carbide over the main surface of the substrate.

5. A semiconductor device according to claim 1, wherein the impurity concentration of the channel layer is homogeneous along the side surface of the trench.

6. A semiconductor device according to claim 1, wherein the impurity concentration of the channel layer is identical to the impurity concentration of the second layer.

7. A semiconductor device according to claim 1, wherein the first layer is formed between the channel layer and the second layer.

8. A manufacturing method of a semiconductor device, comprising the steps of:

(a) forming a structure in which a drift layer of a first conductivity type, a first layer of the first conductivity type, a body layer of a second conductivity type which is different from the first conductivity type, and a source layer of the first conductivity type are stacked in sequence over the main surface of a substrate of the first conductivity type comprising silicon carbide;

(b) forming a mask having an opening in a predetermined region over the source layer;

(c) processing the source layer, the body layer and the first layer using the mask, and forming a trench penetrating the source layer, the body layer, and the first layer and reaching the drift layer;

(d) forming a channel layer of the second conductivity type in the body layer exposed at the side surface of the trench along the side surface of the trench and forming a second layer of the second conductivity type in the drift layer exposed at the bottom surface of the trench along the bottom surface of the trench by implanting ions of impurities of the second conductivity type from the direction forming a first angle to the normal direction of the main surface of the substrate;

(e) forming a gate insulating film so as to cover the side surface and the bottom surface of the trench; and (f) forming a gate electrode in the interior of the trench through the gate insulating film.

9. A manufacturing method of a semiconductor device according to claim 8, wherein the first angle in the step (d) is 3 to 15 degrees.

10. A manufacturing method of a semiconductor device according to claim 8, the step (a) including the steps of:

(a1) forming a third layer of the first conductivity type comprising silicon carbide over the main surface of the substrate;

(a2) forming the first layer by implanting ions of impurities of the first conductivity type between a first position in the third layer having a first distance from the top surface of the third layer and a second position in the third layer having a second distance which is larger than the first distance from the top surface of the third layer;

(a3) forming the body layer by implanting ions of impurities of the second conductivity type between the first position and a third position in the third layer having a third distance which is smaller than the first distance from the top surface of the third layer; and (a4) forming the source layer by implanting ions of impurities of the first conductivity type between the top surface of the third layer and the third position; and wherein at the step (a3), ions having implantation energies different from each other are implanted two or more times.

11. A manufacturing method of a semiconductor device according to claim 8, wherein the impurity concentration of the first layer is higher than the impurity concentration of the drift layer and the impurity concentration of the channel layer and the impurity concentration of the channel layer is higher than the impurity concentration of the body layer.

12. A manufacturing method of a semiconductor device according to claim 8, wherein the impurity concentration of the channel layer is ten or more times higher than the impurity concentration of the body layer.

13. A manufacturing method of a semiconductor device according to claim 8, wherein the impurity concentration of the channel layer is homogeneous along the side surface of the trench.

14. A manufacturing method of a semiconductor device according to claim 8, wherein the impurity concentration of the channel layer is identical to the impurity concentration of the second layer.

15. A manufacturing method of a semiconductor device according to claim 8, wherein the first layer is formed between the channel layer and the second layer.

* * * * *